(12) United States Patent
Choi et al.

(10) Patent No.: US 7,403,145 B2
(45) Date of Patent: Jul. 22, 2008

(54) DATA DRIVER AND DRIVING METHOD OF ORGANIC LIGHT EMITTING DISPLAY DEVICE USING THE SAME

(75) Inventors: Sang Moo Choi, Suwon (KR); Yong Sung Park, Seoul (KR); Do Youb Kim, Yongin (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/580,562

(22) Filed: Oct. 13, 2006

(65) Prior Publication Data

US 2007/0132621 A1 Jun. 14, 2007

(30) Foreign Application Priority Data

Dec. 8, 2005 (KR) ............... 10-2005-0119869

(51) Int. Cl.
*H03M 1/66* (2006.01)
(52) U.S. Cl. .............................. 341/144; 341/154
(58) Field of Classification Search ................ 341/144, 341/145, 154; 345/48
See application file for complete search history.

(56) References Cited

U.S. PATENT DOCUMENTS 5,523,772 A * 6/1996 Lee .................. 345/98
5,943,000 A * 8/1999 Nessi et al. ............. 341/154
6,724,336 B2 * 4/2004 Leung et al. ............. 341/145
6,778,120 B2 * 8/2004 Matsui .................. 341/145

FOREIGN PATENT DOCUMENTS

KR 10-2005-0078449 8/2005

\* cited by examiner

*Primary Examiner*—Jean B Jeanglaude
(74) *Attorney, Agent, or Firm*—Christie, Parker & Hale, LLP (57) ABSTRACT

A data driver capable of generating data signals with desired voltage values. The data driver includes a first digital-analog converter including a plurality of first switches, the first digital-analog converter selecting two reference voltages from among a plurality of reference voltages by turning on two of the first switches corresponding to high level bits of data; and a second digital-analog converter for dividing the two reference voltages into a plurality of voltages and for supplying any one of the two reference voltages and the divided voltages corresponding to low level bits of the data as a data signal to an output terminal, wherein the second digital-analog converter includes a transistor turned on by a bias voltage to compensate for a turn-on resistance of the two of the first switches.

22 Claims, 6 Drawing Sheets

DATA DRIVER AND DRIVING METHOD OF ORGANIC LIGHT EMITTING DISPLAY DEVICE USING THE SAME

CROSS-REFERENCE TO RELATED APPLICATION

This application claims priority to and the benefit of Korean Patent Application No. 10-2005-0119869, filed on Dec. 8, 2005, in the Korean Intellectual Property Office, the entire content of which is incorporated herein by reference.

BACKGROUND

1. Field of the Invention

The present invention relates to a data driver and an organic light emitting display device using the same and a driving method thereof, and more particularly, to a data driver and an organic light emitting display device using the same and a driving method thereof, in which data signals with a desired voltage value can be generated.

2. Discussion of Related Art

An organic light emitting device is a flat display device that displays images using organic light emitting diodes (OLEDs) for generating light by a recombination of electrons and holes. The organic light emitting display device has a rapid response speed and can be driven with low power consumption. The organic light emitting display device generates light by supplying currents corresponding to data signals to the organic light emitting diodes using driving thin film transistors formed in respective pixels.

The organic light emitting display device displays images with a desired brightness by generating the data signals using data supplied from an external source and supplying the data signals to the pixels. Here, a data driver is used to convert the data supplied from the external source to the data signals.

SUMMARY OF THE INVENTION

An aspect of the present invention provides a data driver and an organic light emitting display device using the same and a driving method thereof, in which data signals with desired voltage values can be generated.

A data driver according to an embodiment of the present invention includes: a first digital-analog converter including a plurality of first switches, the first digital-analog converter selecting two reference voltages from among a plurality of reference voltages by turning on two of the first switches corresponding to high level bits of data; and a second digital-analog converter for dividing the two reference voltages into a plurality of voltages and for supplying any one of the two reference voltages and the divided voltages corresponding to low level bits of the data as a data signal to an output terminal, wherein the second digital-analog converter includes a transistor turned on by a bias voltage to compensate for a turn-on resistance of the two of the first switches.

In one embodiment, the second digital-analog converter includes: a plurality of voltage division resistors located between the two of the first switches, the plurality of voltage division resistors dividing the two reference voltages, and a plurality of second switches located between a plurality of nodes of the voltage division resistors and the output terminal, the second switches being adapted to turn-on corresponding to the low level bits of the data.

In one embodiment, each resistance of the voltage division resistors is set up to be substantially identical.

In one embodiment, the transistor is installed between either one of the two of the first switches and the voltage division resistors.

In one embodiment, a voltage level of the bias voltage is set such that a resistance of any one of the voltage division resistors is substantially identical to a turn-on resistance of the transistor summed with the turn-on resistance of the two of the first switches.

An organic light emitting display device according to an embodiment of the present invention includes: a display region including a plurality of pixels connected to a plurality of scan lines and a plurality of data lines; a scan driver for driving the scan lines; and a data driver for driving the data lines, wherein the data driver includes: a first digital-analog converter including a plurality of first switches, the first digital-analog converter being adapted to select two reference voltages from among a plurality of reference voltages by turning on two of the first switches corresponding to high level bits of data; and a second digital-analog converter including a transistor turned on by a bias voltage with a voltage level to compensate for a turn-on resistance of the two of the first switches, a plurality of voltage division resistors for dividing the two reference voltages into a plurality of voltages, and a plurality of second switches for supplying any one of the two reference voltages and the divided voltages corresponding to low level bits of the data as a data signal to an output terminal.

In one embodiment, each resistance of the voltage division resistors is set up to be substantially identical.

In one embodiment, the transistor is installed between either one of the two of the first switches and the voltage division resistors.

In one embodiment, the voltage level of the bias voltage is set such that a resistance of any one of the voltage division resistors is substantially identical to a turn-on resistance of the transistor summed with the turn-on resistance of the two of the first switches.

A driving method of an organic light emitting display device according to an embodiment of the present invention includes: supplying a plurality of reference voltages to a first digital-analog converter; selecting two reference voltages from among the plurality of reference voltages by turning on two of a plurality of first switches included in the first digital-analog converter corresponding to high level bits of data; compensating for a turn-on resistance of the two of the first switches using a bias voltage level of a transistor included in a second digital-analog converter; dividing the two reference voltages using a plurality of voltage division resistors included in the second digital-analog converter, and supplying any one of the two reference voltages and the divided voltages as a data signal to an output terminal of the second digital-analog converter.

In one embodiment, in the dividing of the two reference voltages, the voltage level of the bias voltage is set such that a resistance of any one of the voltage division resistors is substantially identical to a turn-on resistance of the transistor summed with the turn-on resistance of the two of the first switches.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

An organic light emitting display device includes a data driver. The data driver includes a data signal generation part to convert the external data to the data signals. The data signal generation part includes digital-analog converters (hereinafter also referred to as "DACs"), located in each channel, to convert the data to the data signals. Here, the DACs are classified into first (1) DACs for generating voltages corresponding to the high level bits of the data and second (2) DACs for generating voltages corresponding to the low level bits of the data.

Figure 1:
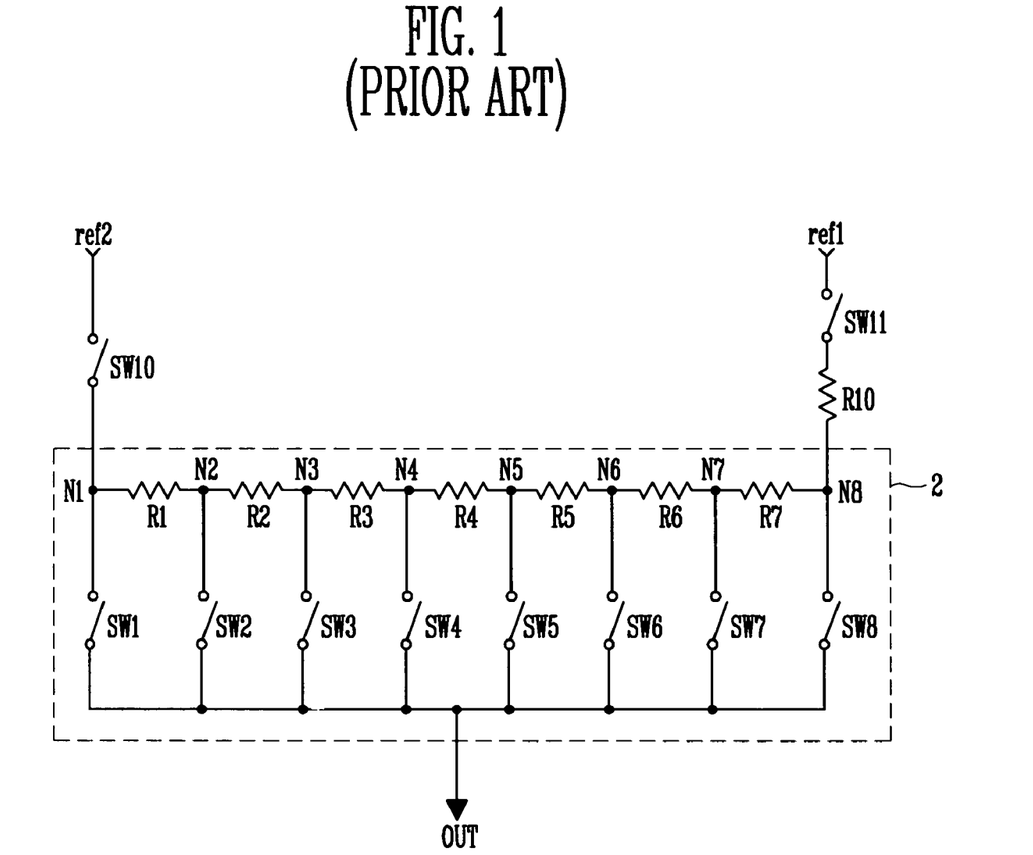
FIG. 1 is a view illustrating a conventional digital-analog converter.

FIG. 1 is a view illustrating a conventional second (2) DAC.

Referring to FIG. 1, a conventional second (2) DAC 2 is supplied with a first reference voltage ref1 and a second reference voltage ref2 from a first (1) DAC. In operation, the first (1) DAC is supplied with multiple reference voltages from an external source, and selects the first reference voltage ref1 and the second reference voltage ref2 among the multiple reference voltages corresponding to the high level bits of the data and supplies them to the second (2) DAC 2. That is, a 10th switch SW10 and an 11th switch SW11 included in the first (1) DAC are turned on corresponding to the high level bits of the data. Hereinafter, for convenience of description purposes, it will be assumed that a voltage level of the first reference voltage ref1 is set to be lower than that of the second reference voltage ref2.

The second (2) DAC 2 includes a plurality of voltage division resistors R1, R2, R3, R4, R5, R6, and R7 for dividing the voltage value of the first reference voltage ref1 and the second reference voltage ref2, and switches SW1, SW2, SW3, SW4, SW4, SW5, SW6, SW7, and SW8 for supplying voltages divided by the voltage division resistors R1 to R7 to an output terminal OUT.

The second (2) DAC 2 also includes a resistor R10 located between the eleventh switch SW11 and the seventh resistor R7. The tenth resistor R10 compensates the switch resistance of the tenth switch SW10 and the eleventh switch SW11 so that uniformly divided voltages may be generated over the voltage division resistors R1 to R7. For this, the resistance value of the tenth resistor R10 is summed to the resistance of the tenth switch SW10 (turn-on resistance) and the resistance of the eleventh switch SW11 (turn-on resistance) (hereinafter, also referred to as "sum resistance"), and then is set to be approximately equal to that of the seventh resistor R7.

The voltage division resistors R1 to R7, installed in series between the first reference voltage ref1 and the second reference voltage ref2, divide the voltage value of the first reference voltage ref1 and the second reference voltage ref2. For this, each of the voltage division resistors R1 to R7 is set to have the same resistance. In addition, FIG. 1 shows seven (7) voltage division resistors R1 to R7 because it is assumed that there are three (3) low level bits of the data.

The switches SW1 to SW8, installed in each node of the voltage division resistors R1 to R7, supply the voltage divided by the voltage division resistors R1 to R7 to the output terminal OUT.

The first switch SW1, installed between a first node N1 and the output terminal OUT, supplies the second reference voltage ref2 to the output terminal OUT. The second switch SW2, installed between a second node N2 and the output terminal OUT, supplies the voltage value of the second node N2 to the output terminal OUT. The third switch SW3, installed between a third node N3 and the output terminal OUT, supplies the voltage value of the third node N3 to the output terminal OUT. The fourth switch SW4, installed between a fourth node N4 and the output terminal OUT, supplies the voltage value of the fourth node N4 to the output terminal OUT. The fifth switch SW5, installed between a fifth node N5 and the output terminal OUT, supplies the voltage value of the fifth node N5 to the output terminal OUT. The sixth switch SW6, installed between a sixth node N6 and the output terminal OUT, supplies the voltage value of the sixth node N6 to the output terminal OUT. The seventh switch SW7, installed between a seventh node N7 and the output terminal OUT, supplies the voltage value of the seventh node N7 to the output terminal OUT. The eighth switch SW8, installed between an eighth node N8 and the output terminal OUT, supplies the first reference voltage ref1 to the output terminal OUT.

Here, the low level bits of the data are used to selectively decide when the switches SW1 to SW8 are to be turned on. In other words, one or more of the switches SW1 to SW8 may be turned on corresponding to one or more of the low level bits of the data to supplying a voltage (or a predetermined voltage) to the output terminal OUT. Also, the voltage supplied to the output terminal OUT is supplied to pixels as data signals.

The aforementioned second (2) DAC 2 has a problem in that it cannot supply data signals with correct voltage value due to process variation of the switches in the second (2) DAC 2, etc. More specifically, turn-on resistances of the tenth switch SW10 and the eleventh switch SW11 may highly vary (or differ) depending on process conditions. Accordingly, the sum resistance of the turn-on resistance of the tenth switch SW10, the turn-on resistance of the eleventh switch SW11, and the resistance of the tenth resistor R10 may be different to each resistance of the voltage division resistors R1 to R7. As such, if the sum resistance were to be different from each resistance of the voltage division resistors R1 to R7, it would be difficult (or impossible) to supply the data signals with the correct voltage values to the pixels. That is, in proper operation, the sum resistance should be set up to be equal (or substantially equal) to each resistance of the voltage division resistors R1 to R7 so that the voltage values of the first reference voltage ref1 and second reference voltage ref2 may be divided uniformly. Further, conventionally, the turn-on resistances of the tenth switch SW10 and the eleventh switch SW11 may differ from the originally designed values to such a degree that the second (2) DAC 2 may have to be discarded from use, causing the manufacturing cost to be raised.

Figure 2:
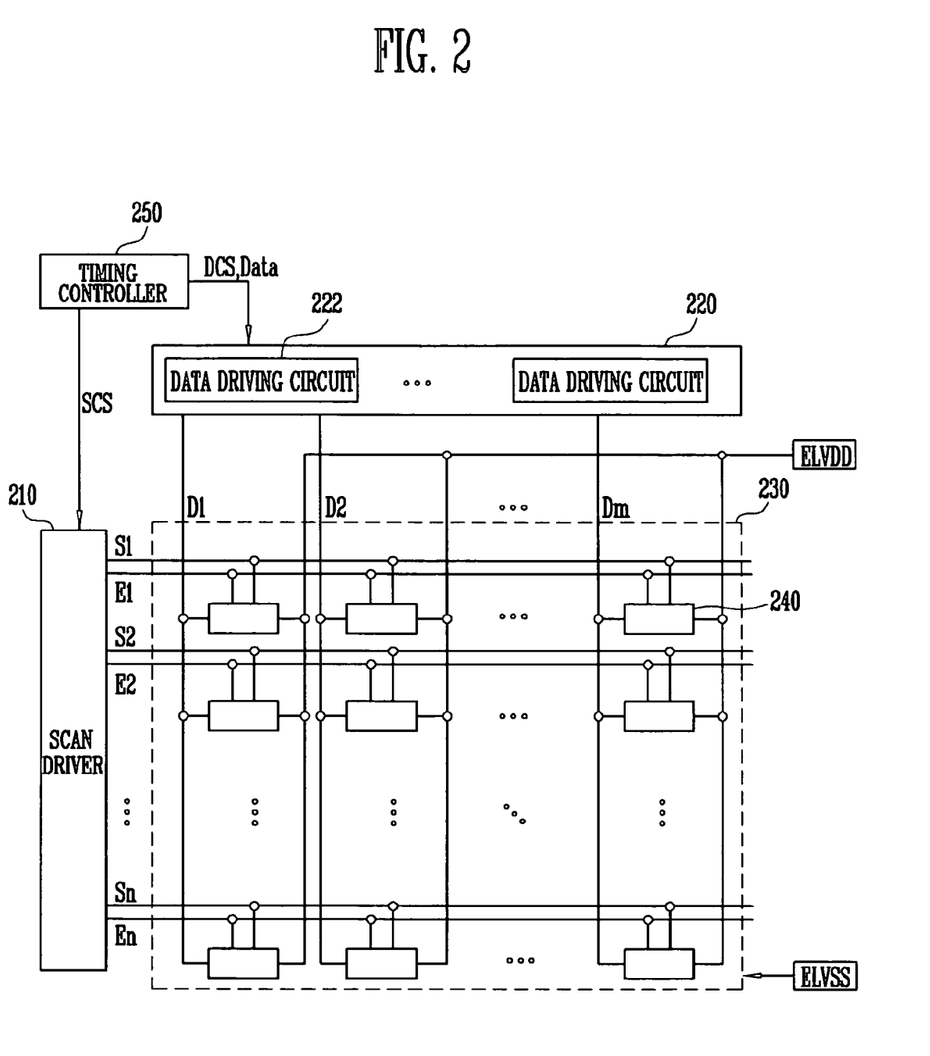
FIG. 2 is a view illustrating an organic light emitting display device according to an embodiment of the present invention.

FIG. 2 is a view illustrating a light emitting display device according to an embodiment of the present invention.

Referring to FIG. 2, the light emitting display device includes a display region 230 including pixels 240 formed in crossing (or intersection) regions defined by scan lines S1 to Sn and data lines D1 to Dm, a scan driver 210 for driving the scan lines S1 to Sn, a data driver 220 for driving the data lines D1 to Dm, and a timing controller 250 for controlling the scan driver 210 and the data driver 220.

The scan driver 210 generates scan signals in response to scan driving control signals SCS from the timing controller 250, and supplies (or sequentially supplies) the generated scan signals to the scan lines S1 to Sn. In addition, the scan driver 210 generates light emitting control signals in response to the scan driving control signals SCS, and supplies (or sequentially supplies) the generated light emitting control signals to light emitting control lines E1 to En.

The data driver 220 generates data signals in response to data driving control signals DCS from the timing controller 250, and supplies (or sequentially supplies) the generated data signals to the data lines D1 to Dm. For this, the data driver 220 includes at least one data driving circuit (or a plurality of data driving circuits) 222. The data driving circuit 222 converts data supplied from an external source to data signals and supplies the data signals to the data lines D1 to Dm. A construction of the data driving circuit 222 will be described in more detail below.

The timing controller 250 generates the data driving control signals DCS and the scan driving control signals SCS corresponding to synchronization signals supplied from an external source. The data driving control signals DCS generated in the timing controller 250 are supplied to the data driver 220, and the scan driving control signals SCS are supplied to the scan driver 210. In addition, the timing controller 250 rearranges the data supplied from the external source and then supplies the data to the data driver 220.

The display region 230 is externally supplied with a first power of a first power source ELVDD and a second power of a second power source ELVSS. In more detail, the first power of the first power source ELVDD and the second power of the second power source ELVSS supplied to the display region 230 are supplied to the respective pixels 240. The pixels 240 supplied with the first power of the first power source ELVDD and the second power of the second power source ELVSS generate images corresponding to the data signals supplied from the data driving circuit 222.

Figure 3:
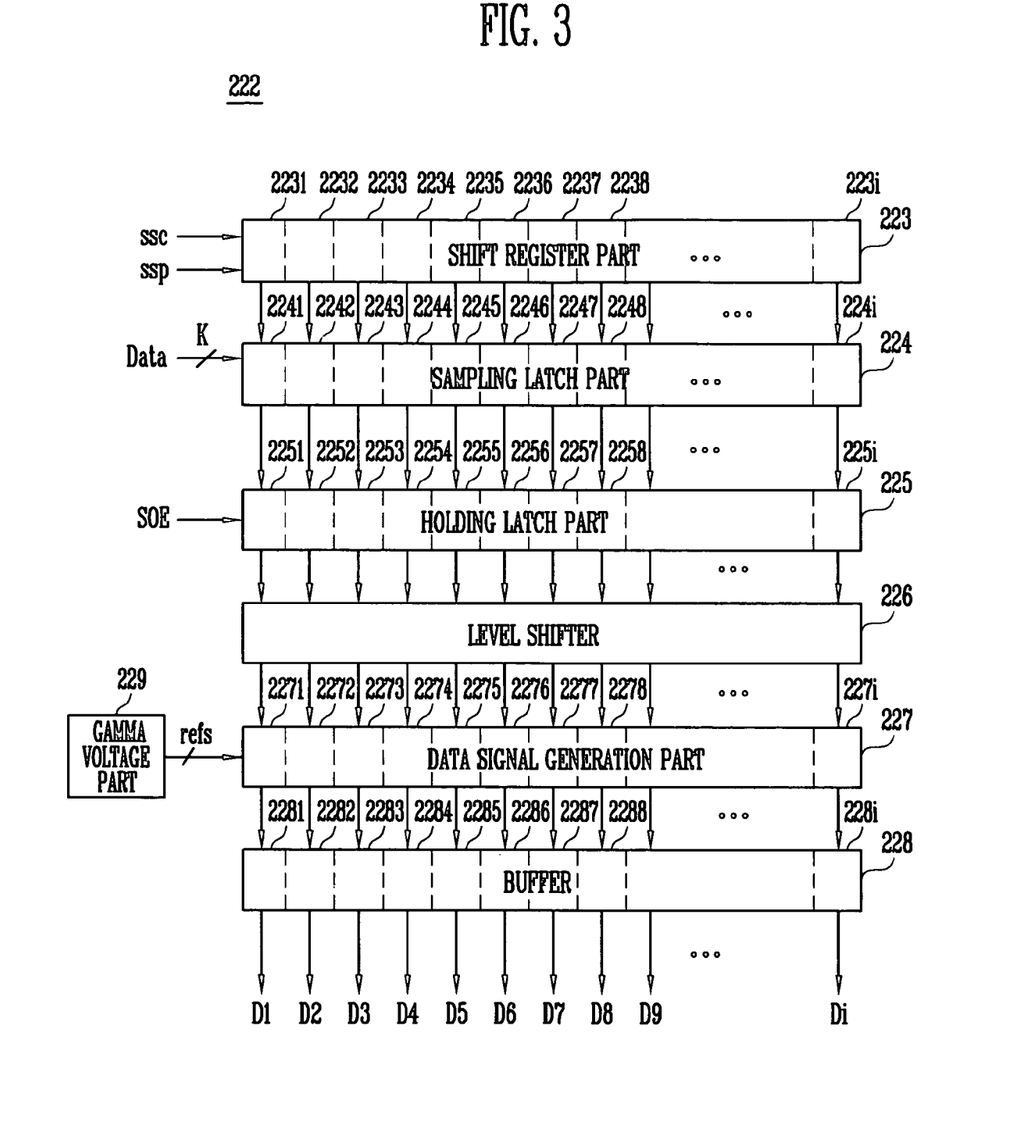
FIG. 3 is a view illustrating a data driver shown in FIG. 2.

FIG. 3 is a detailed block diagram illustrating the data driving circuit 222 shown in FIG. 2. For convenience of description purposes, it is assumed in FIG. 3 that the data driving circuit 222 has i channels.

Referring to FIG. 3, the data driving circuit 222 includes a shift register part 223 for supplying (or sequentially supplying) sampling signals, a sampling latch part 224 for storing (or sequentially storing) data in response to the sampling signals, a holding latch part 225 for temporarily storing (or holding) the data stored in the sampling latch part 224 and for supplying the data stored in the sampling latch part 224 to a level shifter 226 (also included in the data driver 222) and for raising the voltage level of the data, a data signal generation part 227 for generating data signals corresponding to digital values of the data, and a buffer 228 for supplying the data signals to data lines D1 to Di.

The shift register part 223 is supplied with a source shift clock ssc and a source start pulse ssp from the timing controller 250. The shift register part 223 supplied with the source shift clock ssc and the source start pulse ssp generates (or sequentially generates) i sampling signals while shifting the source start pulse ssp corresponding to the source shift clock ssc. For this, the shift register part 223 includes i shift register parts 2231 to 223i.

The sampling latch part 224 stores (or sequentially stores) the data corresponding to the sampling signals supplied (or sequentially supplied) from the shift register part 223. For this, the sampling latch part 224 includes i sampling latches 2241 to 224i to store i data. Here, the size of each sampling latch 2241 to 224i is set up to be capable of storing k bits of the data. Hereinafter, for convenience of description purposes, it is assumed that k is 6.

The holding latch part 225 is inputted with and stores the data from the sampling latch part 224 in response to a source output enable (SOE) signal supplied from the timing controller 250, and supplies the stored data to the level shifter 226. For this, the holding latch part 225 includes i holding latches 2251 to 225i. Each of the holding latches 2251 to 225i includes k bits to allow for sufficient storing of the data.

The level shifter 226 raises the voltage level of the data supplied from the holding latch part 225 and then supplies the raised voltage level of the data to the data signal generation part 227. By contrast, if a device were to supply the data with high voltage level from an external source to the data driver 220, expensive high voltage circuit parts corresponding to the high voltage level need to be used, thus causing the manufacturing cost to be raised. Therefore, by using the level shifter 226, the data with low voltage level are supplied from an exterior source to the data driver 220, which in turn are stepped up to the high voltage level in the level shifter 226. As such, low voltage circuit parts corresponding to the low voltage level may be used (in place of the expensive high voltage circuit parts). On the other hand, the present invention is not thereby limited, and, in an alternative embodiment of the present invention, the level shifter 226 may be omitted. In this alternative embodiment, the holding latch part 225 is directly connected to the data signal generation part 227.

The data signal generation part 227 generates data signals corresponding to digital values (or gray level values) of the data, and supplies the generated data signals to the buffer 228. In operation, the data signal generation part 227 is supplied with reference voltages refs from a gamma voltage part 229 and generates the data signals using the supplied reference voltages refs. A construction of the data signal generation part 227 will be described in more detail below.

The gamma voltage part 229 supplies the reference voltages refs to the data signal generation part 227. The gamma voltage part 229 may be installed inside or outside the data driving circuit 222.

The buffer 228 supplies the data signals supplied from the data signal generation part 227 to the data lines D1 to Di.

Figure 4:
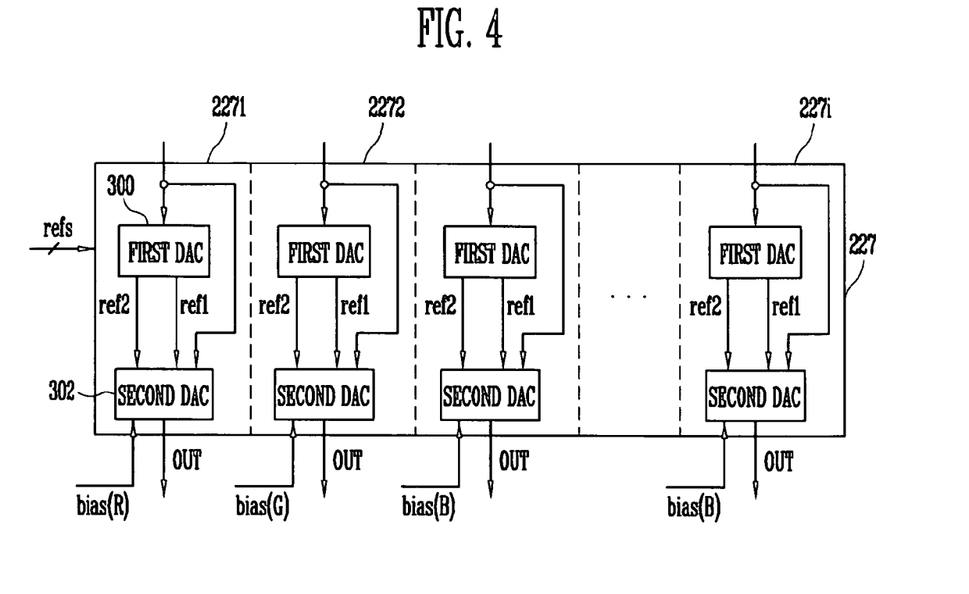
FIG. 4 is a view illustrating a data signal generation part shown in FIG. 3.

FIG. 4 is a view illustrating a data signal generation part shown in FIG. 3.

Referring to FIG. 4, the data signal generation part 227 according to the present invention includes a first DAC 300 and a second DAC 302 installed in each channel.

Among reference voltages refs supplied from the gamma voltage part 229 corresponding to the high level bits of the data supplied from the level shifter 226 or the holding latch part 225, the first DAC 300 selects a first reference voltage ref1 and a second reference voltage ref2. The first DAC 300 supplies the first reference voltage ref1 and the second reference voltage ref2 to the second DAC 302. In other words, the first DAC 300 extracts two reference voltages among the multiple reference voltages refs corresponding to the digital values of the top 3 bits, and supplies the two extracted reference voltages to the second DAC 302 as the first and second reference voltages ref1, ref2. Hereinafter, for convenience of description purposes, it will be assumed that a voltage level of the first reference voltage ref1 is set up to be lower than that of the second reference voltage ref2.

Referring also to FIG. 2, a red pixel 240, a green pixel 240, and a blue pixel 240 of the organic light emitting display device respectively have different light emitting efficiencies. That is, in the case where data signals with the same voltage are supplied, brightness represented in the red pixel 240, brightness represented in the green pixel 240, and brightness represented in the blue pixel 240 are different from one another. To compensate for these differences, the gamma voltage part 229 generates reference voltages refs for the red pixel 240, reference voltages for the green pixel 240, and reference voltages for the blue pixel 240. For example, the gamma voltage part 229 may generate 9 reference voltages refs for generating data signals to be supplied to the red pixel 240, 9 reference voltages refs for generating data signals to be supplied to the green pixel 240, and 9 reference voltages refs for generating data signals to be supplied to the blue pixel 240 (i.e., the gamma voltage part 229 may generate a total of 27 reference voltages refs).

The second DAC 302 divides the first and second reference voltages ref1, ref2 into a plurality of voltages. In addition, the second DAC 302 supplies an output terminal OUT with any one of the first reference voltage ref1, the second reference voltage ref2, and the divided voltages as a data signal corresponding to the bottom 3 bits of the data.

On the other hand, the second DAC 302 compensates turn-on resistance of switches included in the first DAC 300 using a bias voltage. Here, a red bias voltage bias (R) is supplied to the second DAC 302 for generating red data signals to the red pixel 240, a green bias voltage bias (G) is supplied to the second DAC 302 for generating green data signals to the green pixel 240, and a blue bias voltage bias (B) is supplied to the second DAC 302 for generating blue data signals to the blue pixel 240. In operation, the turn-on resistance of the switches included in the first DAC 300 for the red pixel 240, the turn-on resistance of the switches included in the first DAC 300 for the green pixel 240, and the turn-on resistance of the switches included in the first DAC 300 for the blue pixel 240 are set up to be different from one another, and the turn-on resistance of the switches included in the first DAC 300 for the red pixel 240, the turn-on resistance of the switches included in the first DAC 300 for the green pixel 240, and the turn-on resistance of the switches included in the first DAC 300 for the blue pixel 240 are to be supplied with reference voltages with different voltage values. Accordingly, the present invention may compensate the turn-on resistances of the switches by setting up the voltage values of the red bias voltage bias (R), the green bias voltage bias (G), and the blue bias voltage bias (B) differently.

Figure 5:
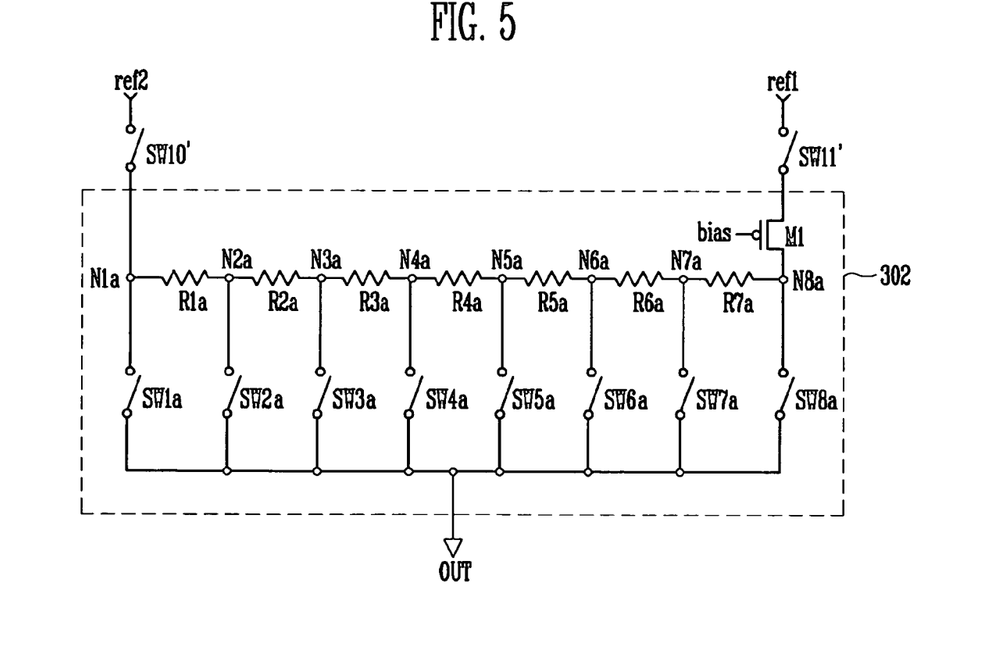
FIG. 5 is a view illustrating a first embodiment of a second digital-analog converter shown in FIG. 4.

FIG. 5 is a view illustrating the second DAC 302 according to a first embodiment of the present invention.

FIG. 5 further shows a tenth switch SW10' and an eleventh switch SW11' turned on to supply the second DAC 302 with the first reference voltage ref1 and the second reference voltage ref2. In operation, the first DAC 300 includes a plurality of switches that include the tenth switch SW10' and the eleventh switch SW11'. The tenth switch SW10' and the eleventh switch SW11' are turned on corresponding to the high level bits of the data. Here, the plurality of switches included in the first DAC 300 have the same (or approximately the same) turn-on resistance since they are formed under the same process conditions.

Referring to FIG. 5, the second DAC 302 according to the first embodiment of the present invention includes a plurality of voltage division resistors R1a, R2a, R3a, R4a, R5a, R6a, and R7a for dividing the first reference voltage ref1 and the second reference voltage ref2, and a plurality of switches SW1a, SW2a, SW3a, SW4a, SW5a, SW6a, SW7a, and SW8a for supplying the voltages divided by the voltage division resistors R1a to R7a to an output terminal OUT.

The voltage division resistors R1a to R7a, installed in series between the first reference voltage ref1 and the second reference voltage ref2, divide the voltage value between the first reference voltage ref1 and the second reference voltage ref2. For this, each of the voltage division resistors R1a to R7a is set up to have the same resistance. Here, although 7 voltage division resistors R1a to R7a are shown because it is assuming that the low level bits of the data have 3 bits, the present invention is not limited thereto.

The switches SW1a to SW8a, installed in each node of the voltage division resistors R1a to R7a, supply the voltages divided by the voltage division resistors R1a to R7a to the output terminal (out).

The first switch SW1a, installed between a first node N1a and the output terminal OUT, supplies the second reference voltage ref2 to the output terminal OUT. The second switch SW2a, installed between a second node N2a and the output terminal OUT, supplies the voltage value of the second node N2a to the output terminal OUT. The third switch SW3a, installed between a third node N3a and the output terminal OUT, supplies the voltage value of the third node N3a to the output terminal OUT. The fourth switch SW4a, installed between a fourth node N4a and the output terminal OUT, supplies the voltage value of the fourth node N4a to the output terminal OUT. The fifth switch SW5a, installed between a fifth node N5a and the output terminal OUT, supplies the voltage value of a fifth node N5a to the output terminal OUT. The sixth switch SW6a, installed between a sixth node N6a and the output terminal OUT, supplies the voltage value of the sixth node N6a to the output terminal OUT. The seventh switch SW7a, installed between a seventh node N7a and the output terminal OUT, supplies the voltage value of the seventh node N7a to the output terminal OUT. The eighth switch SW8a, installed between an eighth node N8a and the output terminal OUT, supplies the first reference voltage ref1 to the output terminal OUT.

Here, the 3 low level bits decide whether the switches SW1a to SW8a are turned on. In other words, one or more of the switches SW1a to SW8a are turned on corresponding to one or more of the 3 low level bits of the data to supply one or more voltages (or one or more predetermined voltages) to the output terminal OUT. The one or more voltages supplied to the output terminal OUT are supplied as the data signals via the buffer 228 to the pixels 240.

In addition, the second DAC 302 includes a transistor M1 located between the eleventh switch SW11' and the voltage division resistors R1a to R7a. The transistor M1 is turned on corresponding to the bias voltage to supply the first reference voltage ref1 to the voltage division resistors R1a to R7a. Here, the transistor M1 compensates the turn-on resistances of the tenth and eleventh switches SW10', SW11' so that the data signals with the desired voltage values may be generated in the second DAC 302. For this, the turn-on resistance of transistor M1 is controlled so that the sum resistance of the turn-on resistance of the tenth switch SW10', the turn-on resistance of the eleventh switch SW11', and the turn-on resistance of the transistor M1 may be set up to be identical (or substantially identical) to resistance of any one of the voltage division resistors R1a to R7a. The turn-on resistance of the transistor M1 is controlled by the bias voltage value.

For example, the present invention can set the turn-on resistance of the transistor M1 higher by controlling the voltage level of the bias voltage if the turn-on resistance of the tenth switch SW10' and the turn-on resistance of the eleventh switch SW11' are lower than the originally designed values. Further, the present invention can set the turn-on resistance of the transistor M1 lower by controlling the voltage level of the bias voltage if the turn-on resistance of the tenth switch SW10' and the turn-on resistance of the eleventh switch SW11' are higher than the originally designed values. That is, the present invention may compensate the turn-on resistances of the tenth and eleventh switches SW10', SW11' using the voltage level of the bias voltage supplied to the transistor M1, and thus generate data signals with desired values. As such, the present invention provides a simple and reliable apparatus to compensate the turn-on resistances of the tenth and eleventh switches SW10', SW11', and thus secure the reliability of the second DAC 302 and at the same time reduce the manufacturing cost of the second DAC 302.

In addition, the bias voltage is divided into a red bias voltage bias (R), a green bias voltage bias (G), and a blue bias voltage (B) as shown in FIG. 4. The red bias voltage bias (R) is supplied to the transistor M1 included in the second DAC 302 for generating the red data signals, the green bias voltage bias (G) is supplied to the transistor M1 included in the second DAC 302 for generating the green data signals, and the blue bias voltage bias (B) is supplied to the transistor M1 included in the second DAC 302 for generating the blue data signals.

Figure 6:
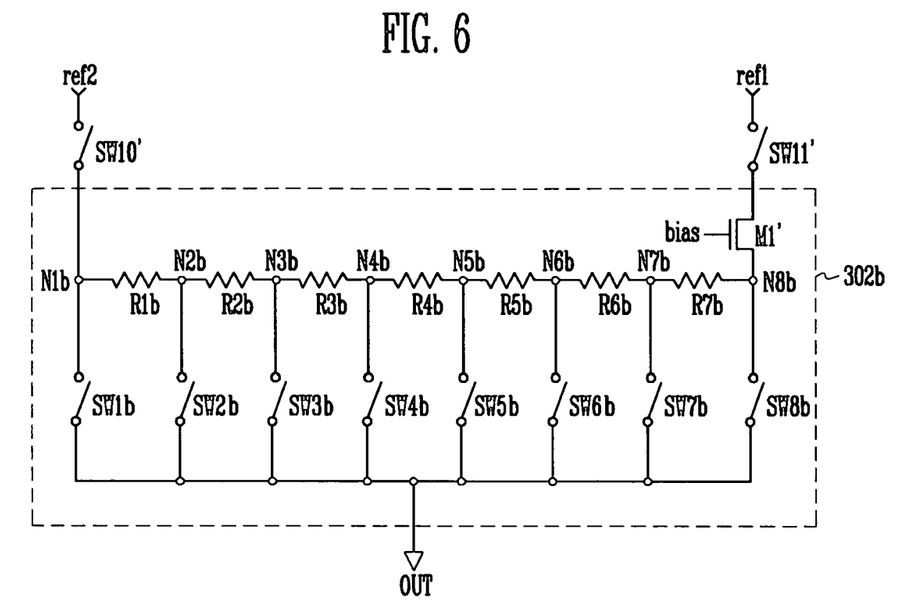
FIG. 6 is a view illustrating a second embodiment of a second digital-analog converter shown in FIG. 4.

Further it should be understood to those skilled in the art that although FIG. 5 shows a PMOS type transistor as the transistor M1, the present invention is not limited thereto. For example, the present invention may install NMOS type transistor as a transistor M1' (in place of the transistor M1 of FIG. 5) as shown in FIG. 6. That is, FIG. 6 is a view illustrating a second DAC 302b according to a second embodiment of the present invention.

In addition, the second DAC 302b according to the second embodiment of the present invention includes a plurality of voltage division resistors R1b, R2b, R3b, R4b, R5b, R6b, and R7b for dividing the first reference voltage ref1 and the second reference voltage ref2, and a plurality of switches SW1b, SW2b, SW3b, SW4b, SW5b, SW6b, SW7b, and SW8b for supplying the voltages divided by the voltage division resistors R1b to R7b to an output terminal OUT.

The first switch SW1b, installed between a first node N1b and the output terminal OUT, supplies the second reference voltage ref2 to the output terminal OUT. The second switch SW2b, installed between a second node N2b and the output terminal OUT, supplies the voltage value of the second node N2b to the output terminal OUT. The third switch SW3b, installed between a third node N3b and the output terminal OUT, supplies the voltage value of the third node N3b to the output terminal OUT. The fourth switch SW4b, installed between a fourth node N4b and the output terminal OUT, supplies the voltage value of the fourth node N4b to the output terminal OUT. The fifth switch SW5b, installed between a fifth node N5b and the output terminal OUT, supplies the voltage value of a fifth node N5b to the output terminal OUT. The sixth switch SW6b, installed between a sixth node N6b and the output terminal OUT, supplies the voltage value of the sixth node N6b to the output terminal OUT. The seventh switch SW7b, installed between a seventh node N7b and the output terminal OUT, supplies the voltage value of the seventh node N7b to the output terminal OUT. The eighth switch SW8b, installed between an eighth node N8b and the output terminal OUT, supplies the first reference voltage ref1 to the output terminal OUT.

Figure 7:
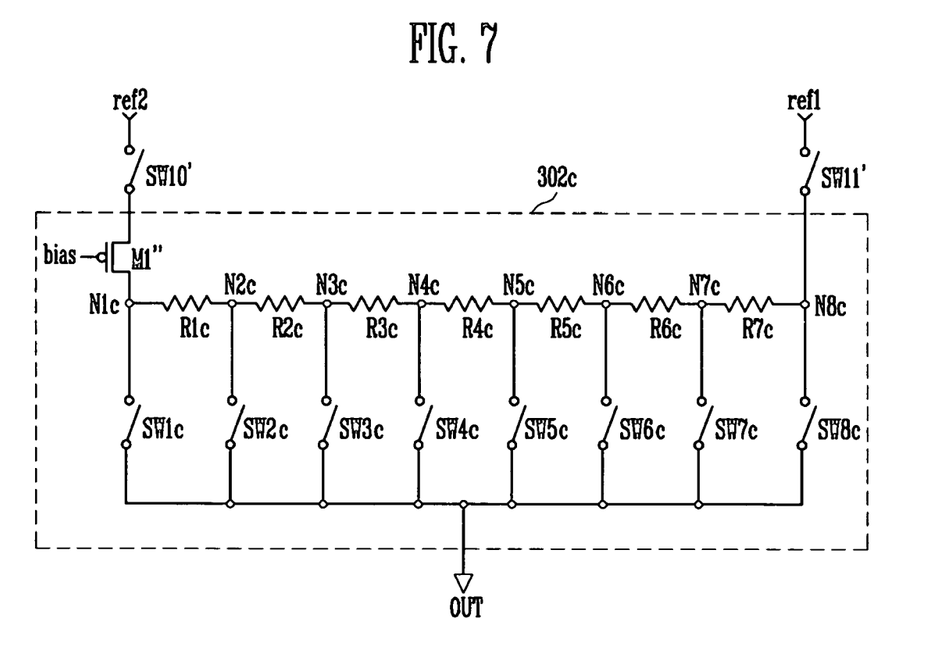
FIG. 7 is a view illustrating a third embodiment of a second digital-analog converter shown in FIG. 4.

FIG. 7 is a view illustrating a second DAC 302c according to a third embodiment of the present invention. The second DAC 302c according to the third embodiment of the present invention includes a plurality of voltage division resistors R1c, R2c, R3c, R4c, R5c, R6c, and R7c for dividing the first reference voltage ref1 and the second reference voltage ref2, and a plurality of switches SW1c, SW2c, SW3c, SW4c, SW5c, SW6c, SW7c, and SW8c for supplying the voltages divided by the voltage division resistors R1c to R7c to an output terminal OUT.

The first switch SW1c, installed between a first node N1c and the output terminal OUT, supplies the second reference voltage ref2 to the output terminal OUT. The second switch SW2c, installed between a second node N2c and the output terminal OUT, supplies the voltage value of the second node N2c to the output terminal OUT. The third switch SW3c, installed between a third node N3c and the output terminal OUT, supplies the voltage value of the third node N3c to the output terminal OUT. The fourth switch SW4c, installed between a fourth node N4c and the output terminal OUT, supplies the voltage value of the fourth node N4c to the output terminal OUT. The fifth switch SW5c, installed between a fifth node N5c and the output terminal OUT, supplies the voltage value of a fifth node N5c to the output terminal OUT. The sixth switch SW6c, installed between a sixth node N6c and the output terminal OUT, supplies the voltage value of the sixth node N6c to the output terminal OUT. The seventh switch SW7c, installed between a seventh node N7c and the output terminal OUT, supplies the voltage value of the seventh node N7c to the output terminal OUT. The eighth switch SW8c, installed between an eighth node N8c and the output terminal OUT, supplies the first reference voltage ref1 to the output terminal OUT. In describing FIG. 7, a detailed description of the parts having substantially the same constructions as the parts of FIG. 5 will not be provided again.

Referring to FIG. 7, a transistor M1" of the second DAC 302c according to the third embodiment of the present invention is installed between the first resistor R1c and a tenth switch SW10'. The transistor M1" compensates for the turn-on resistances of the tenth and eleventh switches SW10', SW11' while the turn-on resistance of the transistor M1" is controlled corresponding to a bias voltage applied to the transistor M1".

Figure 8:
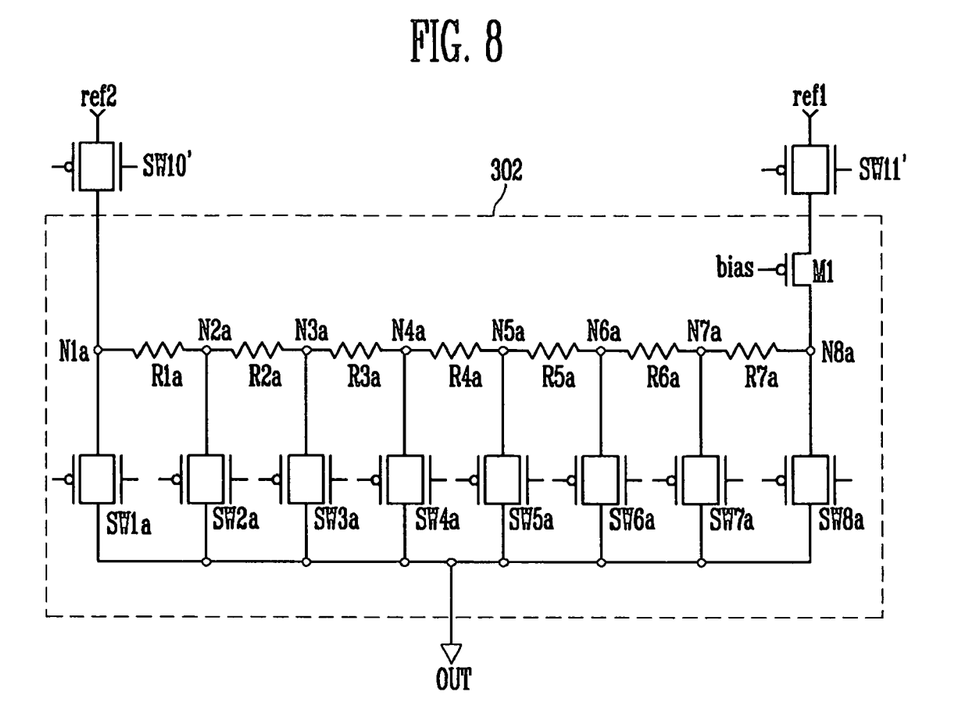
FIG. 8 is a view illustrating an implementation example of switches shown in FIG. 5.

FIG. 8 is a view illustrating an implementation example of switches shown in FIG. 5.

Referring to FIG. 8, the switches SW1a to SW7a, SW10', and SW11' are connected to one another in a transmission gate form. In other words, each of the switches SW1a to SW7b, SW10', and SW11' is constructed by a pair of NMOS and PMOS transistors, which is turned on/off corresponding to the digital values of the data.

As mentioned above, a data driver and an organic light emitting display device using the same and a driving method thereof according to embodiments of the present invention may compensate for turn-on resistances of switches included in a first DAC while adding a transistor to a second DAC and adjusting the voltage level of a bias voltage supplied to the added transistor. Therefore, although the turn-on resistances of the switches may differ from the originally designed values due to process variation and the like, the present invention may still compensate for the turn-on resistances of the switches using the bias voltage level, and thus generate data signals with desired voltage values. In addition, the present invention may improve quality/reliability of the second DAC (or the quality/reliability of the manufacturing throughput) and thus reduce the manufacturing cost, since it can compensate for the turn-on resistances of the switches using the bias voltage level supplied to the transistor.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A data driver comprising:
   a first digital-analog converter including a plurality of first switches, the first digital-analog converter being adapted to select two reference voltages from among a plurality of reference voltages by turning on two of the first switches corresponding to high level bits of data; and
   a second digital-analog converter for dividing the two reference voltages into a plurality of voltages and for supplying any one of the two reference voltages and the divided voltages corresponding to low level bits of the data as a data signal to an output terminal,
   wherein the second digital-analog converter includes a transistor turned on by a bias voltage to compensate for a turn-on resistance of the two of the first switches.

2. The data driver as claimed in claim 1, wherein the second digital-analog converter includes:
   a plurality of voltage division resistors located between the two of the first switches, the plurality of voltage division resistors being adapted to divide the two reference voltages, and
   a plurality of second switches located between a plurality of nodes of the voltage division resistors and the output terminal, the second switches being adapted to turn on corresponding to the low level bits of the data.

3. The data driver as claimed in claim 2, wherein each resistance the voltage division resistors is set up to be substantially identical.

4. The data driver as claimed in claim 2, wherein the transistor is installed between either one of the two of the first switches and the voltage division resistors.

5. The data driver as claimed in claim 4, wherein a voltage level of the bias voltage is set such that a resistance of any one of the voltage division resistors is substantially identical to a turn-on resistance of the transistor summed with the turn-on resistance of the two of the first switches.

6. The data driver as claimed in claim 1, wherein the data signal comprises a red data signal to be supplied to a red pixel, a green data signal to be supplied to a green pixel, and a blue data signal to be supplied to a blue pixel.

7. The data driver as claimed in claim 6, wherein the transistor included in the second digital-analog converter for supplying the red data signal is supplied with a red bias voltage, the transistor included in the second digital-analog converter for supplying the green data signal is supplied with a green bias voltage, and the transistor included in the second digital-analog converter for supplying the blue data signal is supplied with a blue bias voltage.

8. The data driver as claimed in claim 7, wherein the voltage values of the red, green, and blue bias voltages are set up to be different from one another.

9. The data driver as claimed in claim 1, wherein the transistor is a PMOS type or an NMOS type.

10. The data driver as claimed in claim 2, wherein each of the two of the first switches and each of the second switches are configured by connecting a PMOS type transistor and/or a NMOS type transistor in a transmission gate form.

11. The data driver as claimed in claim 1, further comprising:
   a shift register part for supplying a sampling signal;
   a sampling latch part for storing the data in response to the sampling signal;
   a holding latch part for storing the data stored in the sampling latch part; and
   a data signal generation part for receiving the data from the holding latch part and for generating the data signal,
   wherein each channel of the data signal generation part includes the first digital-analog converter and the second digital-analog converter.

12. The data driver as claimed in claim 11, further comprising:
   a level shifter located between the holding latch part and the data signal generation part, the level shifter being adapted to raise a voltage level of the data, and
   a buffer for receiving the data signal from the data signal generation part.

13. An organic light emitting display device comprising:
   a display region including a plurality of pixels connected to a plurality of scan lines and a plurality of data lines;
   a scan driver for driving the scan lines; and
   a data driver for driving the data lines,
   wherein the data driver comprises:
   a first digital-analog converter including a plurality of first switches, the first digital-analog converter being adapted to select two reference voltages from among a plurality of reference voltages by turning on two of the first switches corresponding to high level bits of data; and
   a second digital-analog converter including a transistor turned on by a bias voltage with a voltage level to compensate for a turn-on resistance of the two of the first switches, a plurality of voltage division resistors for dividing the two reference voltages into a plurality of voltages, and a plurality of second switches for supplying any one of the two reference voltages and the divided voltages corresponding to low level bits of the data as a data signal to an output terminal.

14. The organic light emitting display device as claimed in claim 13, wherein each resistance of the voltage division resistors is set to be substantially identical.

15. The organic light emitting display device as claimed in claim 14, wherein the transistor is installed between either one of the two of the first switches and the voltage division resistors.

16. The organic light emitting display device as claimed in claim 15, wherein the voltage level of the bias voltage is set such that a resistance of any one of the voltage division resistors is substantially identical to a turn-on resistance of the transistor summed with the turn-on resistance of the two of the first switches.

17. The organic light emitting display device as claimed in claim 13, wherein the transistor is a PMOS type or an NMOS type.

18. The organic light emitting display device as claimed in claim 13, wherein each of the two of the first switches and each of the second switches are configured by connecting a PMOS transistor and/or a NMOS type transistor in a transmission gate form.

19. The organic light emitting display device as claimed in claim 13, wherein the data driver comprises:
   a shift register part for supplying a sampling signal;
   a sampling latch part for storing the data in response to the sampling signal;
   a holding latch part for storing the data stored in the sampling latch part; and
   a data signal generation part for receiving the data from the holding latch part and for generating the data signal, wherein each channel of the data signal generation part includes the first digital-analog converter and the second digital-analog converter.

20. The organic light emitting display device as claimed in claim 19, wherein
a level shifter is located between the holding latch part and the data signal generation part, the level shifter being adapted to raise a voltage level of the data, and
a buffer for receiving the data signals from the data signal generation part.

21. A driving method of an organic light emitting display device, the method comprising:
supplying a plurality of reference voltages to a first digital-analog converter;
selecting two reference voltages from among the plurality of reference voltages by turning on two of a plurality of first switches included in the first digital-analog converter corresponding to high level bits of data,
compensating for a turn-on resistance of the two of the first switches using a bias voltage level of a transistor included in a second digital-analog converter,
dividing the two reference voltages using a plurality of voltage division resistors included in the second digital-analog converter, and
supplying any one of the two reference voltages and the divided voltages as a data signal to an output terminal of the second digital-analog converter.

22. The driving method of an organic light emitting display device as claimed in claim 21, wherein in the dividing of the two reference voltages, the voltage level of the bias voltage is set such that a resistance of any one of the voltage division resistors is substantially identical to a turn-on resistance of the transistor summed with the turn-on resistance of the two of the first switches.

* * * * *